United States Patent
Ludowise et al.

(10) Patent No.: US 6,287,947 B1
(45) Date of Patent: Sep. 11, 2001

(54) METHOD OF FORMING TRANSPARENT CONTACTS TO A P-TYPE GAN LAYER

(75) Inventors: Michael J. Ludowise; Steven A. Maranowski, both of San Jose; Daniel A. Steigerwald, Cupertino; Jonathan Joseph Wierer, Jr., Sunnyvale, all of CA (US)

(73) Assignee: LumiLeds Lighting, U.S. LLC, San Jose, CA (US)

( * ) Notice: Subject to any disclaimer, the term of this patent is extended or adjusted under 35 U.S.C. 154(b) by 0 days.

(21) Appl. No.: 09/327,948

(22) Filed: Jun. 8, 1999

(51) Int. Cl.$^7$ .................................................. H01L 21/28
(52) U.S. Cl. .......................................... 438/606; 438/605
(58) Field of Search .................................................. 257/99

(56) References Cited

U.S. PATENT DOCUMENTS

| | | | |
|---|---|---|---|
| 5,652,434 | * 7/1997 | Nakamura et al. | 257/13 |
| 5,877,558 | 3/1999 | Nakamura et al. | 257/749 |
| 5,889,295 | 3/1999 | Rennie et al. | 257/96 |
| 5,977,566 | * 11/1999 | Okazaki et al. | 257/99 |

FOREIGN PATENT DOCUMENTS

| | | | |
|---|---|---|---|
| 0845818A2 | 6/1997 | (EP) | H01L/33/00 |
| 10 012921 A | 1/1998 | (JP) | H01L/33/00 |
| 10-135515 | 5/1998 | (JP) | H01L/33/00 |
| 10-209493 | 8/1998 | (JP) | H01L/33/00 |
| 10-209500 | 8/1998 | (JP) | H01L/33/00 |
| 10 256602 A | 9/1998 | (JP) | H01L/33/00 |
| 1-121804 | * 4/1999 | (JP) . | |

OTHER PUBLICATIONS

Maeda et al. "Effects of NiO on electrical properites of NiAu based ohminc contacts for p–type GaN", Dec. 1999, Applied Physics letters V75, pp 4145–4147.*

Koide et al. "Effects of Annealing in an Oxygen Ambient on Electrical properiles of Ohmic Contacts to p–type GaN", 1999, J. Electronic Mat., V28, pp 341–346.*

Sink et al.,Pulsed operation of cleaved–facet InGaN laser diodes, 1998, MRS conference Boston.*

Ho, Jin–Kuo et al., "Low–resistance ohmic contacts to p–type GaN," Applied Physics Letters, vol. 74, No. 9, Mar. 1, 1999, pp. 1275–1277.

Koide, Yasuo et al., "Effects of Annealing in an Oxygen Ambient on Electrical Properties of Ohmic Contacts to p–Type GaN," Journal of Electronic Materials, vol. 28, No. 3, 1999, pp. 341–346.

Sheu, J.K. et al., "High–transparency Ni/Au ohmic contact to p–type GaN," Applied Physics Letters, vol. 74, No. 16, Apr. 19, 1999, pp. 2340–2342.

* cited by examiner

Primary Examiner—Olik Chaudhuri
Assistant Examiner—Douglas A. Wille
(74) Attorney, Agent, or Firm—Skjerven Morrill MacPherson; Brian D. Ogonowsky; Gergely T. Zimanyi

(57) ABSTRACT

A method of forming a light-transmissive contact on a p-type Gallium nitride (GaN) layer of an optoelectronic device includes in one embodiment, introducing a selected metal in an oxidized condition, rather than oxidizing the metal only after it has been deposited on the surface of the p-type GaN layer. In some applications, the oxidized metal provides sufficient lateral conductivity to eliminate the conventional requirement of a second highly conductive contact metal, such as gold. If the second contact metal is desired, an anneal in an oxygen-free environment is performed after deposition of the second layer. The anneal causes the second metal to penetrate the oxidized metal and to fuse to the surface of the p-type GaN layer. In a second embodiment, the oxidation occurs only after at least one of the two metals is deposited on the surface of the p-type GaN layer. In one application of the second embodiment, the two metals are deposited and the oxidation occurs in an environment that includes both water vapor and oxygen gas. In an alternative application of the second embodiment, the first metallic layer is deposited and then oxidized throughout its depth. The second material, such as gold, is evaporated on the first material and a re-anneal step is performed to drive the second metal through the oxidized first metal. In any of the applications of either embodiment, a pattern of windows may be formed in the resulting contact structure or in additional layers that are formed thereon.

23 Claims, 12 Drawing Sheets

US 6,287,947 B1

METHOD OF FORMING TRANSPARENT CONTACTS TO A P-TYPE GAN LAYER

TECHNICAL FIELD

The invention relates generally to optoelectronic devices, such as light emitting diodes and laser diodes, and relates more particularly to methods of forming contacts to light-emitting layers of optoelectronic devices.

BACKGROUND ART

Optoelectronic devices, such as light emitting diodes (LEDs) and laser diodes, are solid state devices that generate light in response to excitation signals. Traditionally, the most efficient LEDs emit light having a peak wavelength in the red region of the light spectrum. However, a type of LED based on Gallium nitride (GaN) has been developed that can efficiently emit light having a peak wavelength in the blue region of the light spectrum. This LED may provide significantly greater light output than traditional LEDs. Moreover, since blue light has a shorter wavelength than red light, the blue light generated by the GaN-based LED can be readily converted to produce light having a longer wavelength. This efficient conversion increases the likelihood that marketable "white light" LEDs can be fabricated. GaN-based LEDs are also fabricated to generate green light.

In an exemplary known GaN-based LED, a light-emitting semiconductor structure is formed on a sapphire substrate. The semiconductor structure includes an n-type GaN region and a p-type GaN region. These two regions are epitaxially grown. Typically, metalorganic vapor phase epitaxy is used. The p-type GaN may be formed using magnesium (Mg) or zinc (Zn) as a dopant. Other layers may also be included. For example, a buffer layer may be formed between the sapphire substrate and the semiconductor structure to serve as a transition layer that promotes adhesion between the sapphire substrate and the GaN material. The buffer layer may be formed of aluminum nitride (AlN).

In operation, light is generated in response to applying an excitation signal to the p-type GaN region and the n-type GaN region. Thus, ohmic contacts must be formed on these two regions. A concern is that an acceptable low resistance ohmic contact for the p-type GaN material is difficult to fabricate. A number of different structural arrangements and fabrication methods have been tested for forming an acceptable contact region for the p-doped GaN region. Preferably, the contact is light transmissive, so that generated light may escape through the contact. Bi-metal light transmissive contacts are described in Japanese Laid-Open Patent Application (Kokai) Nos. 10-135515 to Shibata and 10-209500 and 10-209493 to Kamimura et al. While other materials are identified in the three references, the preferred materials for forming the contacts are either cobalt (Co) and gold (Au) or nickel (Ni) and Au. A first metal (e.g., Ni or Co) is deposited on the surface of the p-type GaN material. A second metal (e.g., Au) is then deposited on the first metal. The two metals are heat treated in an ambient containing oxygen, causing the first metal to oxidize and causing the second metal to penetrate the first metal and reach the GaN material. If the first metal is Ni, the heat treatment will form a phase of NiO, but the Au remains in the metallic state.

While the known light-transmissive contacts for p-type GaN layers of optoelectronic devices achieve acceptable performance with respect to transmissivity and lateral conductivity along the surfaces of the layers, further improvements are desired. What is needed is a method of forming a light-transmissive contact that has desirable optical and electrical characteristics when applied to a p-type GaN layer.

SUMMARY OF THE INVENTION

A method of forming a light-transmissive contact of a light source having a p-type Gallium nitride (GaN) layer includes, in one embodiment, introducing a selected metal in an oxidized condition, rather than oxidizing the metal only after it has been deposited on the surface of the p-type GaN. Under selected conditions, the oxidized metal contacts provide sufficient lateral conductivity (measured in the parameter $V_f$) to negate the conventional requirement of a second highly conductive contact metal, such as gold (Au). Since the second metal tends to adversely affect the optical transparency of the resulting contact, the reduction of the contact structure to a single oxidized metal is desirable.

In this first embodiment in which the first metal is introduced to the p-type GaN surface in an oxidized condition, the oxidation may occur either prior to or during introduction of the material to the p-type GaN surface. However, the preferred method is to reactively evaporate or reactively sputter the metal onto the surface in an oxidizing environment. The metal is preferably nickel (Ni), or a Group II or transition metal. If a second metal is required, a precious metal is preferred, with gold (Au) being the most preferred metal. For example, Ni may be reactively evaporated or sputtered to form NiO, followed by Au evaporation or sputtering deposition and by an anneal. The anneal causes the Au to penetrate the oxidized metal and to fuse to the surface of the p-type GaN layer. If the temperature is sufficiently high (at least 550° C.), the anneal will activate the p-doping of the GaN layer. As an alternative that is consistent with this first embodiment, the first metal can be doped or infused with the second metal to provide the desired optical characteristics (e.g., a window) and the desired electrical characteristics (i.e., an ohmic contact). For example, a magnesium oxide (MgO) doped or infused with Au or silver (Ag) may provide the desired characteristics. The MgO may be co-deposited with the second metal using co-evaporation or premixing. As used herein, references to the oxides, such as NiO and MgO, are intended to represent all phases of the oxides (e.g., $NiO_x$) and their stoichiometric deviations. Moreover, the term "layer" is intended to include systems of layers that cooperate to achieve desired characteristics. For example, the p-type GaN layer may be a series of p-doped GaN layers.

When the first metal is deposited as an oxide, such as NiO, and a highly conductive second metal is deposited on the transparent metal oxide, the heat treatment that causes diffusion of the second metal through the transparent metal oxide is typically implemented in a non-reactive environment. (However, there may be applications in which an oxygen-containing environment is advantageous.) An environment of $N_2$ may be employed. The optical transmissivity of the contact will be inversely dependent upon the cumulative amount of metallic species in the contact material and is dependent upon the transmissivity of the metal species. On the other hand, the lateral conductivity of the contact is directly dependent upon the amount of contiguous metal species in the contact structure. Thus, transmissivity and lateral conductivity are in conflict. That is, a minimal amount of metal is desirable for optical transparency, but a larger amount of metal provides an increase in lateral conductivity. These two considerations result in selection of an optimal range of layer thickness for the two metals, particularly the highly conductive metal (e.g., Au). Preferably, the first metal has a thickness of less than 150 Å, while the second metal has a thickness of less than 100 Å. The optimal thickness may differ depending upon the application. For example, in a typical device operating at 20 mA drive current, a 50 Å thick Au layer provides a $V_f$ ranging between 3.0 and 3.4 volts with 80% transmissivity at the wavelength of 500 nm. However, for a device in which power efficiency is less of a concern than maximizing luminous output for a given chip area, a $V_f$ ranging from 4.0 to 4.8 volts may be acceptable, so that the Au layer may have a thickness of 5 to 30 Å.

In a second embodiment, the oxidation occurs only after at least one of the two metals is deposited on the surface of the p-type GaN layer. The selection of the metals for forming the contact structure is fundamentally the same as the selection of materials for the first embodiment. One of the materials is primarily selected for its high conductivity (e.g., Au), while the other material is selected for its mechanical characteristics with respect to linking to the p-type GaN layer and for its optical characteristics after under-going oxidation. Ni is the preferred material for undergoing oxidation, but Mg may be used as a substitute in order to enhance the doping of the p-type GaN layer. Other Group II and transition metals may also be used as a substitute for Ni.

In one application of the second embodiment, the two metals are deposited and the oxidation occurs in an environment that includes both water vapor and oxygen gas. The oxygen is mixed with water vapor in concentrations greater than found in room air (i.e., greater than approximately 40% relative humidity at 21° C.). For example, the oxidizing atmosphere may be an electronic grade mixture of 20% oxygen in nitrogen, with the water vapor being added by bubbling gas through a water reservoir held at 95° C. At a sufficiently high temperature (550° C. or above), this process also activates the p-doping. Experimental tests show that the oxygen and water vapor mixture provide more desirable results, as compared to oxidizing atmospheres having oxygen without water vapor or having water vapor in nitrogen in the absence of oxygen. Moreover, the advantages of activating the p-dopant with these schemes derives from several considerations. First, the dopant activation step and the annealing steps described in the various embodiments are combined into a single step. Elimination of steps saves process time, avoids additional thermal degradation of the light emitting structure, and reduces the number of process tools needed. The result is a more cost effective manufacturing process. Second, the layer of metal oxide acts to getter the excess hydrogen, which is the p-dopant passivating agent. Finally, the metal/metal oxide system serves to lower the energy barrier for the decomposition of the hydrogen-p-dopant complex, thus facilitating the activation of the p-dopant during the anneal, which preferably occurs in a mixture of $H_2O$ and $O_2$.

There is also an optimal range of the concentration of Mg [Mg] in the layer adjacent to the Ni/Au contact metals. The concentration of Mg in the layer adjacent to the Ni/Au contact metals affects the conversion of the Ni to NiO. Conversion of the Ni to NiO in dry air with water vapor at temperatures greater than 550° C. is successful only if the concentration of the Mg in the adjacent layer is less than $2\times10^{20}$ cm$^{-3}$. At higher concentrations the Ni does not convert to NiO and the contact is opaque. There is also a lower limit to the Mg concentration with regards to achieving an ohmic contact. Although low Mg concentration layers adjacent to the Ni/Au contact layers will allow the Ni to convert to NiO when oxidized in dry air with water vapor at temperatures greater than 550° C., the contact will not be ohmic. The lower Mg concentration limit required to achieve an ohmic contact is $5\times10^{19}$ cm$^{-3}$. Thus, to achieve a transparent, ohmic contact, the Mg concentration in the adjacent layer needs to be in the range of $5\times10^{19}$ cm$^{-3} \leq$ [Mg]$\leq 2\times10^{20}$ cm$^{-3}$.

In an alternative application of the second embodiment, the first layer to be formed is the Ni material. An oxidation anneal cycle converts the Ni to NiO throughout its depth. The second material, such as gold, is evaporated onto the oxidized first material. A re-anneal drives the second metal through the oxidized material and alloys the second metal to the p-type GaN layer.

The optical characteristics of the contact structure formed using either the first or second embodiment may be enhanced by patterning at least the second metal. That is, if the contact structure is selectively patterned to include windows through a blanket layer of electrically conductive contact material, light output is increased by means of the windows, while sufficient lateral conductivity is maintained by the interconnection of the contact materials. In one application of this concept, only the second metal is patterned, with or without the first metal being in an oxidized condition. An anneal then drives the second metal to the p-type GaN surface. Alternatively, the two metals can be patterned, either before or after the second metal is driven by heat treatment. In yet another application, one or more additional layers are formed on the ohmic contact structure after the second metal has been driven through the oxidized first metal. In this application, the additional layer or layers can be patterned. As an example, a patterned layer of Ag can be formed atop a blanket layer of NiO:Au or atop blanket layers of NiO:Au and indium tin oxide (ITO). Ag is desirable, since a thin Ag layer (less than 100 Å) is more transparent and more conductive than an Au layer of the same thickness. In all applications, the pattern is selected to provide a high lateral conductivity and to enhance transmissivity.

While the embodiments have been described as being limited to one or two layers of metal, other contact structures are contemplated. A NiO layer may be formed on the GaN:Mg surface initially, followed by Ni and Au layers. The initial layer may serve as a "seed" layer for further formation of NiO formed from Ni in an oxidizing atmosphere. The seed layer serves to enhance the reliable formation of further oxides. Other metals and metal oxides may be formed in a similar manner, and a seed material of one metal oxide may serve to enhance the formation of a different metal oxide layer.

The concept of providing more than two layers to the contact structure may be utilized in other implementations. An ITO layer may be deposited atop the first two metal layers. The ITO may be intermixed with the other layers of the contact structure by an anneal step (i.e., the ITO is driven into the other materials that comprise the contact structure), or may be deposited after annealing. The addition of the ITO layer enhances lateral conductivity. It is believed that ITO can also be used as a substitute for the initial NiO layer. As another alternative multi-layer contact structure, a repeating pattern of layers may be provided, such as a repeating pattern of Ni/Au.

A multi-layer stack of Ni/Au/Ni has been tested. During oxidation, the uppermost layer of Ni forms an oxide-initiation layer that allows the oxidation to begin without the Au material masking the oxidation of the Ni. Once the NiO formation has begun, the Au layer dissolves into it, allowing further penetration of the oxygen into the underlying Ni layer. The oxidation process progresses until all of the Ni metal is consumed or converted to transparent oxide, with the Au migrating to the surface of the p-type GaN layer. In this way, the oxidation process is made more reproducible and uniform. The fundamental idea may be extended to more than three layers, which interact during heat treatment to form contact structures with superior optical and/or electrical characteristics, as compared to structures formed from fewer layers. A three-layer stack of Ni/Au/Ni may have a consistent layer thickness of 35 Å.

DETAILED DESCRIPTION

Figure 1:
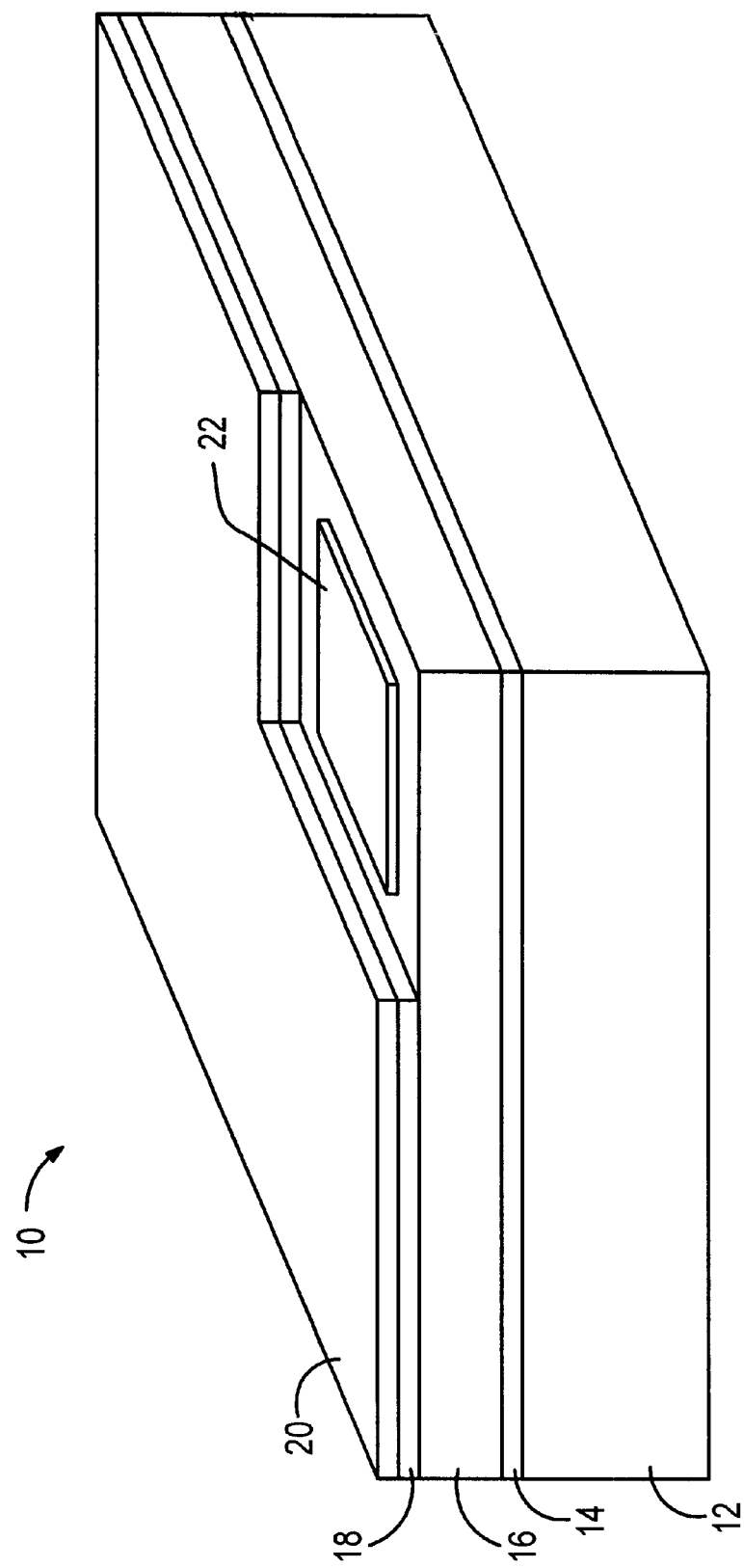
FIG. 1 is a perspective view of an optoelectronic device that does not include a contact structure on the p-type GaN layer.

With reference to FIG. 1, a GaN-based light emitting diode (LED) 10 is shown as including a substrate 12 and a number of layers. The type of substrate and the layers shown in the figure are not critical to the invention, as will be explained below. Conventionally, the substrate 12 is formed of sapphire, but other substrate materials include silicon carbide, zinc oxide and silicon dioxide. In the preferred embodiment, the upper surface of the substrate is textured to randomize the incident light emitted from the active region of the LED. The textured substrate increases the probability of incident light escaping the LED through the sides or upper surface of the semiconductor structure. Moreover, the textured substrate facilitates growth of thick GaN epitaxial layers (layers greater than 7 μm), with a significantly lower susceptibility to cracking, relative to growth on non-patterned substrates.

Optionally, the upper surface of the substrate 14 includes a buffer layer. As an example, the buffer layer may be formed of aluminum nitride and may have a thickness of approximately 25 nm. In a preferred embodiment, at least one of the layers above the buffer layer has a significantly greater thickness than the comparable layer of a conventional LED. The increased thickness allows the light emitted from the active region to escape through the surface of the structure with fewer passes. In particular, the increased thickness increases the likelihood that emitted light will escape from the sides of the device 10 with a single reflection from a layer-to-substrate interface or a layer-to-layer interface. Such light will be referred to as "first pass" extracted light. Each time that light encounters one of the interfaces, a percentage of the light energy may be lost. The increased thickness of one or more layers increases the side surface area through which light can escape after a first reflection. Conventionally, the combined thickness of the layers above the buffer layer 14 is 3 micrometers. However, the combined thickness in the LED 10 of FIG. 1 is preferably at least 7 micrometers, and may exceed 15 micrometers. The formations of thick epitaxial layers in LEDs that utilize GaAs substrates is described in U.S. Pat. No. 5,233,204 to Fletcher et al., which is assigned to the assignee of the present invention.

Above the buffer layer 14 is an n-doped GaN layer 16. As is well known in the art, the GaN material may be epitaxially grown using metalorganic chemical vapor deposition (MOCVD). A GaN nucleation layer may be grown on the sapphire substrate 12 at a low temperature. This is followed by a growth of a thick undoped GaN layer or a properly doped GaN layer. The undoped GaN is inherently n-type, so that the n-type GaN layer 16 is formed to the selected thickness.

Atop the n-type GaN layer 16 is an active region 18. While the active region is shown as a single layer in FIG. 1, the region consists of a number of layers, including a light generation layer or layers in which holes and electrons recombine to generate light. On the opposite sides of the light generation layer are cladding layers, as is well known in the art.

Above the active region 18 is a p-type GaN layer 20. Like the layer 16, the GaN layer 20 is epitaxially grown. A suitable dopant is Mg, but other dopants are used, such as Zn. As will be readily understood by a person skilled in the art, the term "layer" as applied to any of the components 16, 18 and 20 is intended to include systems of layers that cooperate to achieve desired characteristics. For example, the p-type GaN layer 20 may be a series of layers.

As shown in FIG. 1, portions of the active region 18 and the p-type GaN layer 20 are removed to expose the upper surface of the n-type layer 16, allowing a contact 22 to be formed on the layer 16. The contact enables a source of an excitation signal to be applied to the layer 16. The means for forming a low resistance contact on an n-type GaN layer has not created the problems associated with forming a suitable transparent contact structure for the application of a voltage to the p-type GaN layer 20. Consequently, the formation of the n-type contact structure 22 will not be described herein.

Figure 2:
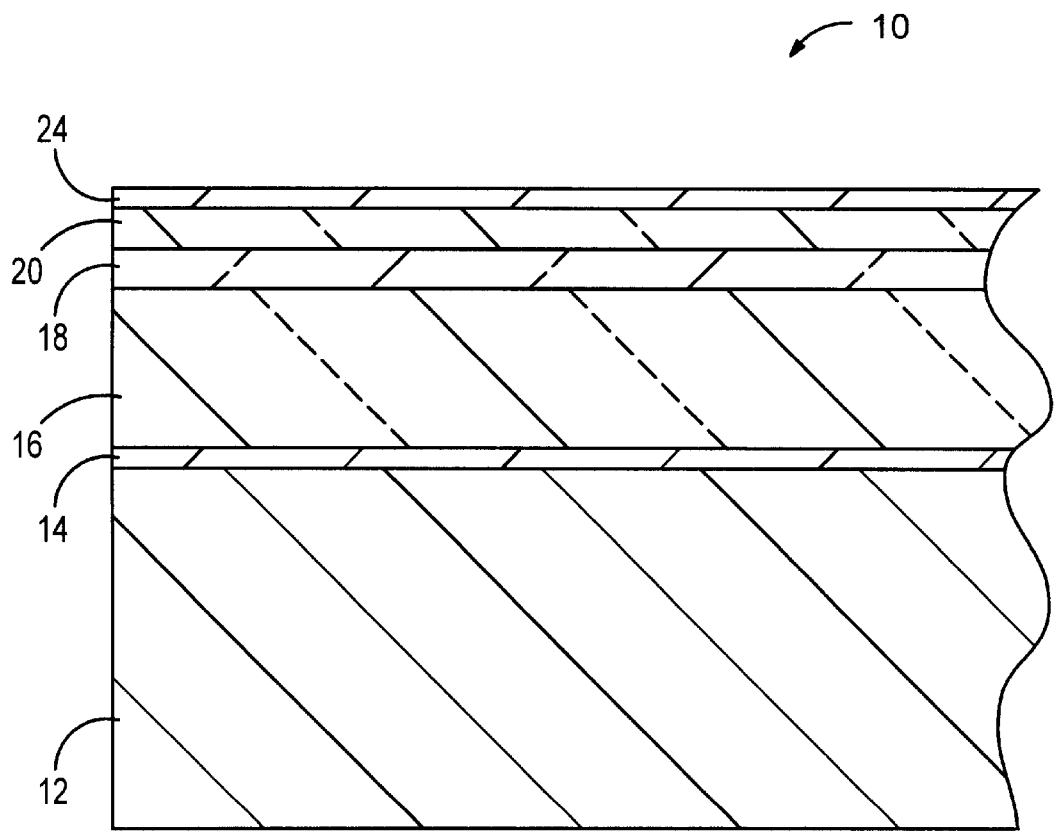
FIG. 2 is a side sectional view of the device of FIG. 1 having a contact structure formed of a transparent metal oxide layer in accordance with one embodiment of the invention.

Referring now to FIG. 2, the LED 10 is shown as having a single-layer contact structure. The layer 24 is a light-transmissive metal oxide that is introduced to the surface of the p-type GaN layer 20 in an oxidized condition. That is, the metal is oxidized prior to or during formation of the layer, rather than being oxidized in an anneal step after deposition. Under selected conditions, the oxidized metal provides sufficient lateral conductivity to eliminate the conventional requirement of a second highly conductive contact metal. In the preferred embodiment, the oxidation occurs during formation, such as by reactive evaporation or reactive sputtering. However, in some applications the metal oxide is formed prior to the LED fabrication procedure (e.g., commercially purchased). If the metal oxide is to be the only material used in forming the contact structure to the p-type GaN layer 20, NiO is the material that has been determined to provide sufficient lateral conductivity. An advantage of using the single-layer contact structure is that the transmissivity of the contact structure is increased. The conventional requirement of providing a second highly conductive contact metal, such as Au, adversely affects light output, since the optical transmissivity of the contact is inversely dependent upon the cumulative amount of metallic species and is dependent upon the transmissivity of the metal species.

Figure 3:
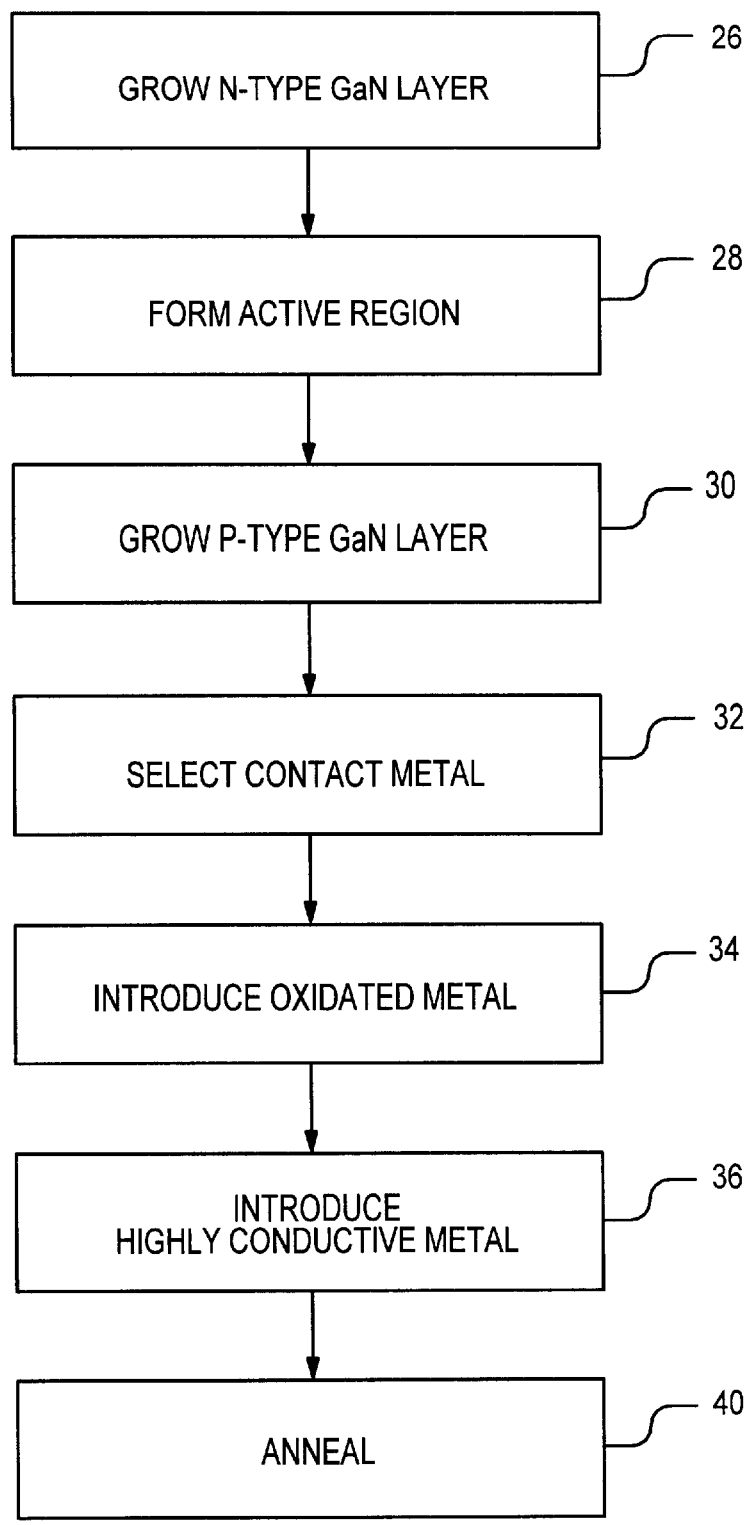
FIG. 3 is a process flow of steps for forming the device of FIG. 2.

The embodiment shown in FIG. 2 is fabricated using the first five steps identified in FIG. 3. That is, the final two steps of FIG. 3 are not necessary in all embodiments. In step 26, the n-type GaN layer 16 is grown. The epitaxial growth is well known in the art. The active region 18 is formed in step 28. As previously noted, the active region is a combination of layers, including a light-generation layer or layers sandwiched between two cladding layers. The p-type GaN layer is grown on the active region, as indicated at step 30. At this point in the fabrication process, the only significant differences between the resulting structure and the conventional LED structure are that the surface of the substrate 12 is preferably roughened and at least one of the GaN layers is preferably thicker than conventional GaN layers of an LED.

In step 32, a contact metal is selected. The desirable characteristics relate to mechanical, optical and electrical properties. Mechanically, the metal should adhere well to the upper surface of the p-type GaN layer. Optically, the metal should be light transmissive when in an oxidized condition. Electrically, the metal should provide a significant lateral conductivity and preferably a low resistance ohmic contact to p-type GaN. This electrical property is particularly important if the single-layer structure of FIG. 2 is to be utilized. As previously noted, Ni is the preferred material. However, Mg may enhance the doping of the p-type GaN layer. Likewise, Zn is desirable if the GaN layer 30 is GaN:Zn. Other Group II or transition metals can be selected. A non-exhaustive list of transparent metal oxides that may be used includes TiO, $SiO_2$, YO, HfO, ZrO, PrO, CoO and the perovskite oxides, such as barium strontium titanate (BST). Another suitable material that provides advantages, particularly when combined with at least one other layer to provide a contact structure, is indium tin oxide (ITO), as will be described more fully below.

In step 34, the selected contact metal is introduced to the surface of the p-type GaN layer 20 in an oxidized condition. The preferred implementation is reactive evaporation or reactive sputtering.

If the single-layer contact structure is utilized, the contact structure for providing lateral conductivity is completed at step 34. Smaller contacts can then be formed on the n-type GaN layer 16 (as shown by the contact point 2 in FIG. 1) and on the upper surface of the light-transmitting metal oxide 24 of FIG. 2.

However, in many applications, the single layer, single metal contact structure on the p-type GaN layer 20 will not be sufficient. Consequently, at least one additional material is used in the formation of a contact structure that provides sufficient lateral conductivity along the p-type GaN layer 20. The metal is preferably a precious metal, and is most preferably Au. A non-exhaustive list of acceptable metals includes Al, Pd, Pt, Co, Zn, Ag, Cd, Hg, Ir, Re, Os, Ru and Rh.

Figure 4:
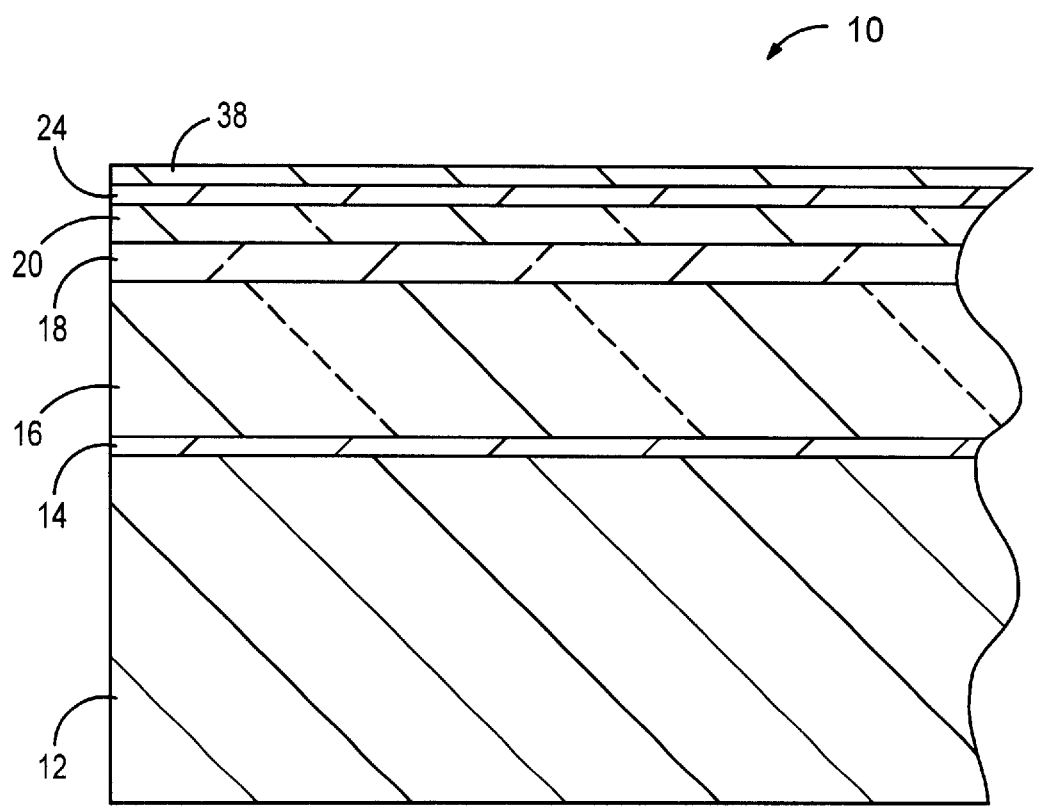
FIG. 4 is a side sectional view of the device of FIG. 1 having a contact structure formed of a combination of the transparent metal oxide layer of FIG. 2 and a highly conductive metal layer.
Figure 5:
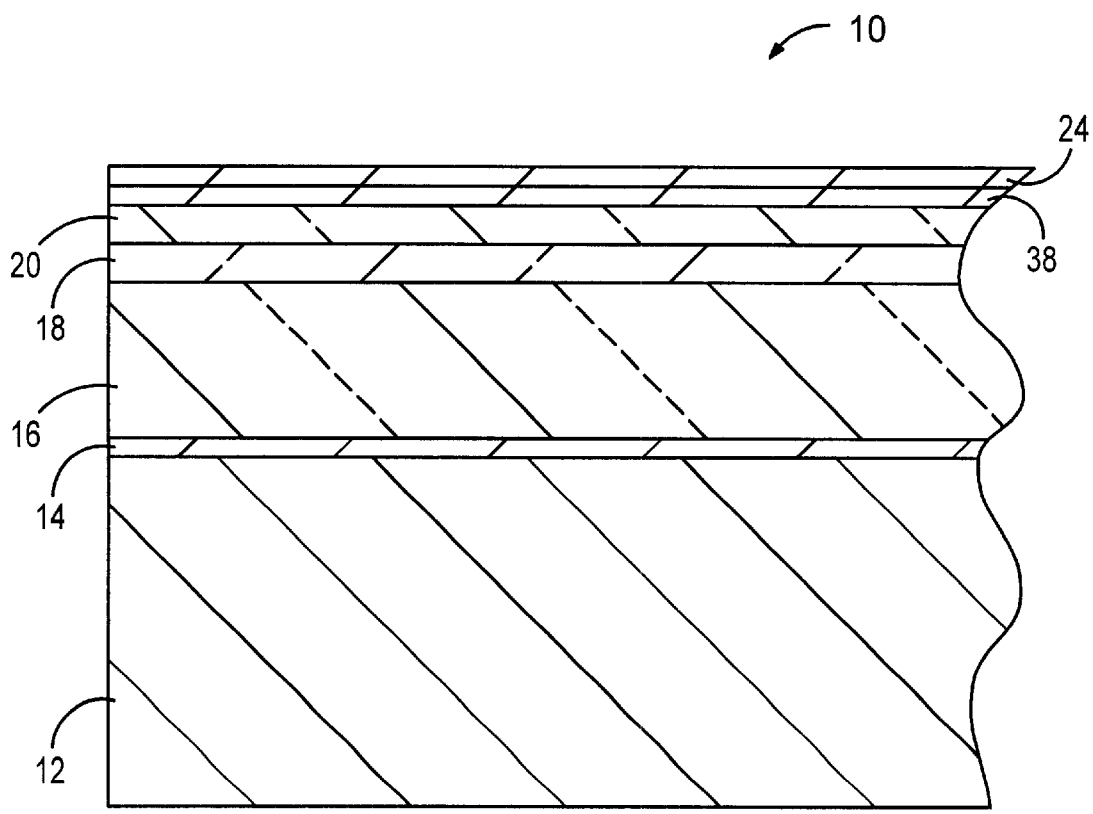
FIG. 5 is a side sectional view of the device of FIG. 4 following an anneal step.

In one method of providing the second lateral conductivity by utilizing a second metal, a highly conductive metal is introduced at step 36 of FIG. 3 to provide the bi-metal contact structure of FIG. 4. The bi-metal contact structure includes the oxidized layer 24 and a highly conductive layer 38. An anneal is then performed at step 40 to cause diffusion of the second metal through the transparent metal oxide layer 24 to the surface of the p-type GaN layer 20. As shown in FIG. 5, following the anneal step, the highly conductive layer 38 is in contact with the p-type GaN layer. Because the layer 24 is oxidized prior to the formation of the layer 38, the anneal step 40 is preferably implemented in a non-reactive environment. That is, an inert or non-reactive gas is preferably utilized. For example, an $N_2$ gas may be utilized at a temperature in the range of 400° to 850° C. However, there may be applications in which an oxygen-containing environment is advantageous.

When the material that is introduced at step 34 is NiO and the metal that is introduced at step 36 is Au, the thickness of the oxide layer 24 is preferably less than 150 Å, while the thickness of the metal layer 38 is preferably less than 100 Å. The optical transmissivity of the contact that is formed following the anneal step 40 is inversely dependent upon the cumulative amount of metallic species in the contact material and is dependent upon the transmissivity of the metal species. On the other hand, the lateral conductivity of the contact structure is directly dependent upon the amount of contiguous metal species in the contact structure. Thus, transmissivity and lateral conductivity are in conflict. A minimum amount of metal is desirable for optical transparency, but a larger amount of metal provides an increase in lateral conductivity. These two considerations result in selection of an optimal range of layer thickness for the two metals, particularly the highly conductive metal (e.g., Au). The optimal thickness of the layers will vary depending upon the application. For example, in a typical device with 20 mA of drive current, a 50 Å thick Au layer provides a $V_f$ ranging between 3.0 and 3.4 volts with 80% transmissivity at the wavelength 500 nm. However, for a device in which power efficiency is less of a concern than maximizing luminous output for a given chip area, a $V_f$ ranging between 4.0 and 4.8 volts may be acceptable, so that the Au layer may have a thickness of 5 to 30 Å.

Figure 6:
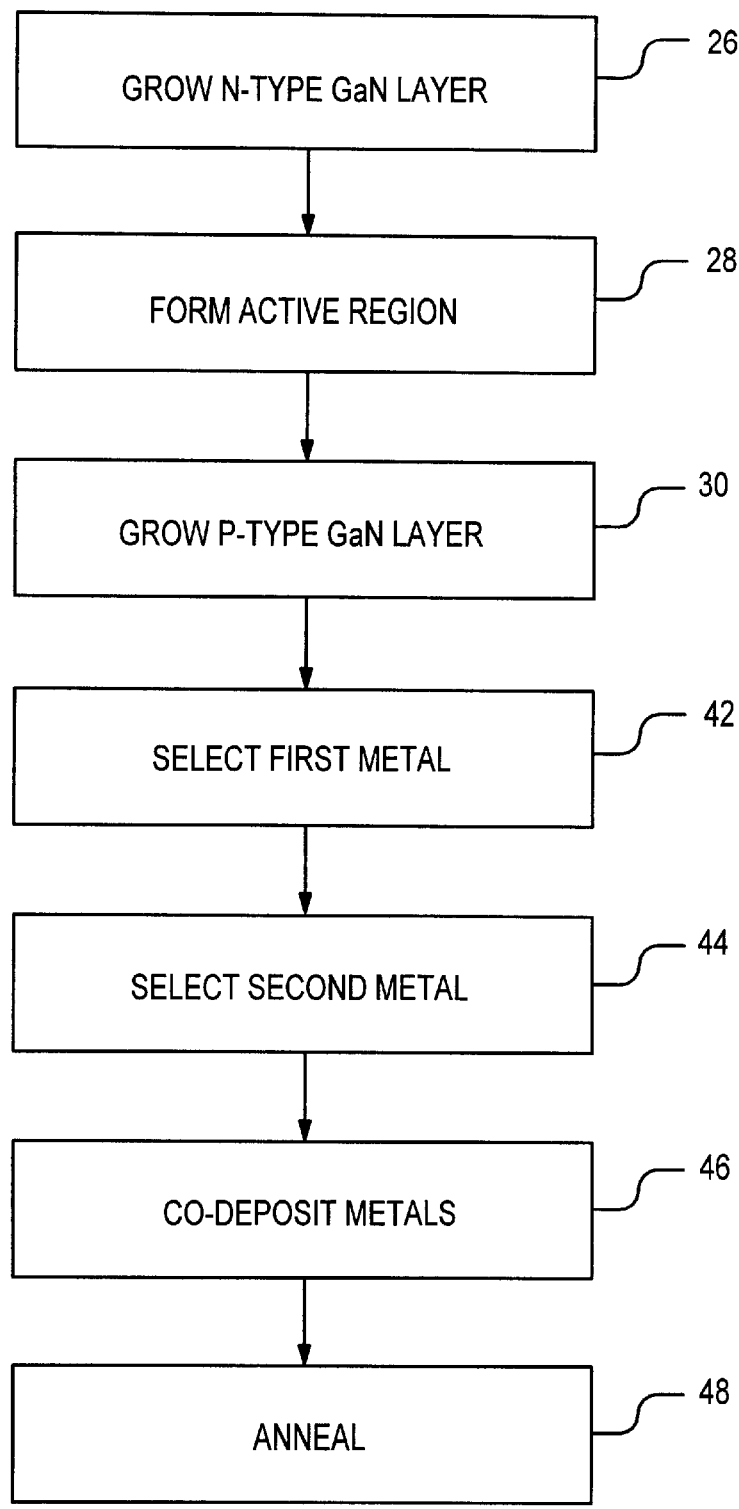
FIG. 6 is a process flow of steps for forming a contact structure in accordance with a second embodiment of the invention.

FIG. 6 is an alternative method of forming a contact structure in which the contact material is oxidized either prior to or during the introduction of material to the p-type GaN layer. Using the steps of FIG. 6, the two metals of the contact structure are co-deposited. The first three steps of growing the n-type GaN layer 26, forming the active region 28, and growing the p-type GaN layer 30 are conventional steps, as described with reference to FIG. 3. In steps 42 and 44, the two contact materials are selected. The two selected metals are then co-deposited at step 46, followed by an anneal step 48 that provides the structure shown in FIG. 5. Preferably, the co-depositing of the metals is carried out using reactive sputtering or reactive evaporation, but other techniques may be employed to deposit the materials such that at least one is in an oxidized condition. An optional anneal step 48 is implemented in an inert or non-reactive gas, such as $N_2$. However, there may be applications in which an oxygen-containing environment is advantageous.

Using the method of FIG. 6, the metal selected in step 42 may be Ni and the metal selected in step 44 may be Au. Thus, the resulting structure will be a NiO:Au that provides desirable electrical and optical characteristics. The NiO may be reactively deposited with the Au by simultaneous evaporation of sputtering.

Regarding selection of the first metal in either of the methods described in FIGS. 3 and 6, NiO is preferred, but not critical. The substitution of MgO for NiO may enhance the p-type doping of the GaN layer 20. MgO doped or infused with Au may mimic the NiO:Au behavior as an ohmic contact and window. Indium tin oxide (ITO) with Au may provide a greater lateral current spread. ZnO may also be used as a substitute for NiO to provide additional doping, similar to the use of MgO. Moreover, combinations of oxidized Group II or transition metals may be used (e.g., NiO with MgO or ZnO).

In the case of Ni/Au contact metals, there is also an optimal range of the concentration of Mg [Mg] in the layer adjacent to the Ni/Au contact metals. The concentration of Mg in the layer adjacent to the Ni/Au contact metals affects the conversion of the Ni to NiO. Conversion of the Ni to NiO in dry air with water vapor at temperatures greater than 550° C. is successful only if the concentration of the Mg in the adjacent layer is less than $2 \times 10^{20}$ cm$^{-3}$. At higher concentrations the Ni does not convert to NiO and the contact is opaque. There is also a lower limit to the Mg concentration with regards to achieving an ohmic contact. Although low Mg concentration layers adjacent to the Ni/Au contact layers will allow the Ni to convert to NiO when oxidized in dry air with water vapor at temperatures greater than 550° C., the contact will not be ohmic. The lower Mg concentration limit required to achieve an ohmic contact is $5 \times 10^{19}$ cm$^{-3}$. Thus, to achieve a transparent, ohmic contact, the Mg concentration in the adjacent layer needs to be in the range of $5 \times 10^{19}$ cm$^{-3} \leq [Mg] \leq 2 \times 10^{20}$ cm$^{-3}$. An optimal Mg concentration range may also exist for other metal/metal oxide combinations.

Figure 7:
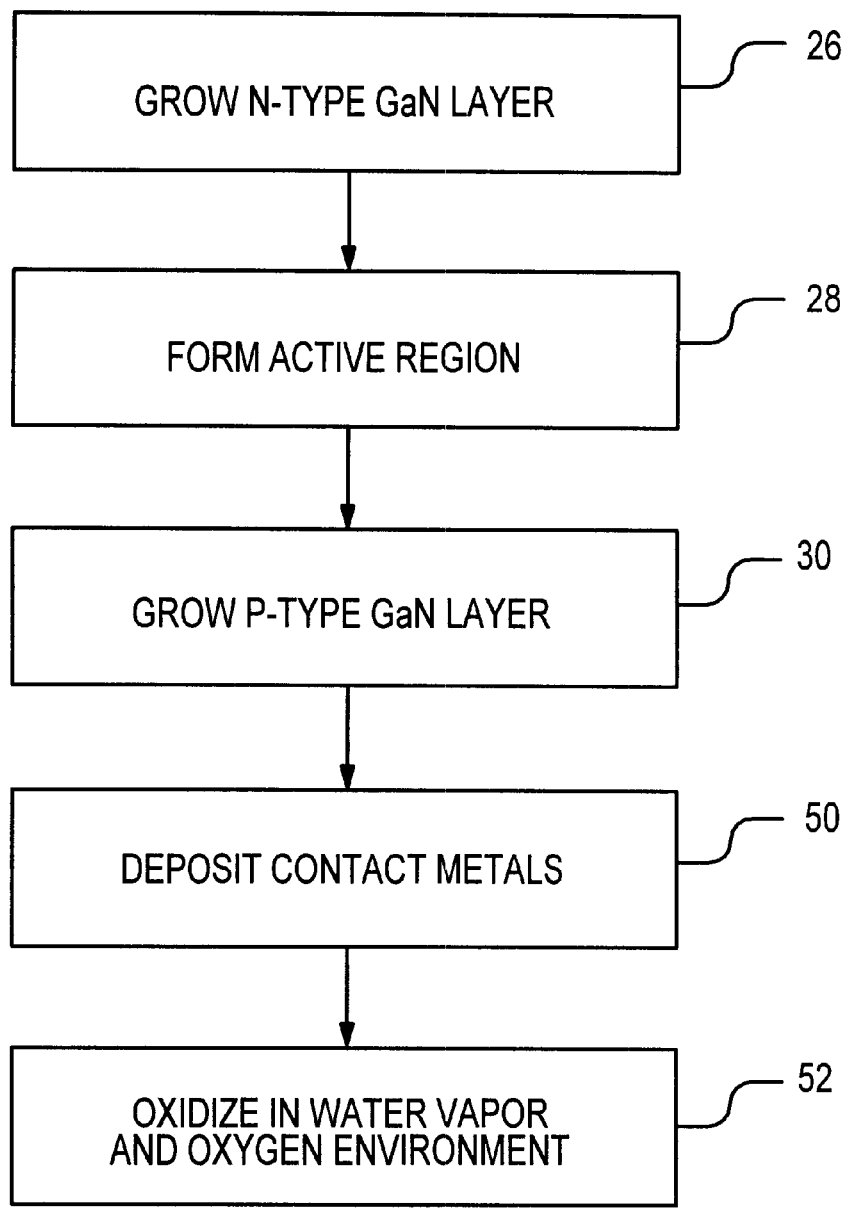
FIG. 7 is a process flow of steps for forming a contact structure in accordance with another application of the invention.

FIG. 7 illustrates another embodiment of the invention. In this embodiment, the oxidation process occurs only after deposition of the contact metals at step 50, which follows the conventional LED fabrication steps 26, 28 and 30. As one example of the deposition step 50, the first metal may be Ni having a thickness of 100 Å, while the second metal may be Au having a thickness of 50 Å.

Experiments have been conducted for converting 100 Å Ni/50 Å Au to NiO:Au in various atmospheres at 625° C. The three atmospheres were (1) nitrogen with water vapor, (2) dry air, and (3) dry air with water vapor. The dry air came from an electronic grade mixture of 20% oxygen in nitrogen and the water vapor was added by bubbling gas through a water reservoir held at 95° C.

In the case of dry air alone, with a flow at 7.5 liters per minute, only a partial conversion of Ni to NiO was evidenced by gray opaque regions over a significant portion of one half of a two-inch diameter GaN device wafer. The sample appeared very similar to the control half of the same wafer, which was oxidized in room air at the same temperature.

In the case of dry nitrogen flowing at 7.5 liters per minute with water vapor, there was considerable conversion to NiO compared to the partial conversion on the control half of the same wafer oxidized in room air. Although more effective in converting the Ni to NiO than room air, the conversion utilizing dry nitrogen with water vapor was not complete.

With regard to the oxidation in dry air with water vapor, the results were significantly better. A substantially complete oxidation of half of a GaN device wafer occurred in a mixture of dry air flowing at 7.5 liters per minute, with water vapor. The control half of the same wafer exhibited only partial oxidation, similar to the control halves of the above-identified wafers. The oxidation step 52 of FIG. 7 is preferably one that utilizes a mixture of oxygen and water vapor, in concentrations higher than found in room air (i.e., greater than 40% relative humidity at 21° C.). The mixture of oxygen and water vapor at the raised temperature provides a more uniform and reproducible oxidation of the Ni/Au structure to NiO:Au. Oxygen without water vapor is far less effective, as is water vapor in nitrogen in the absence of oxygen. At a sufficiently high temperature (within the range of 550° C. to 850° C.) this process also activates the p-doping. Moreover, the advantages of activating the p-dopant with these schemes derives from several considerations. First, the dopant activation step and the annealing steps described in the various embodiments are combined into a single step. Elimination of steps saves process time, avoids additional thermal degradation of the light emitting structure, and reduces the number of process tools needed. The result is a more cost effective manufacturing process. Second, the layer of metal oxide acts to getter the excess hydrogen, which is the p-dopant passivating agent. Finally, the metal/metal oxide system serves to lower the energy barrier for the decomposition of the hydrogen-p-dopant complex, thus facilitating the activation of the p-dopant during the anneal, which preferably occurs in a mixture of $H_2O$ and $O_2$.

Figure 8:
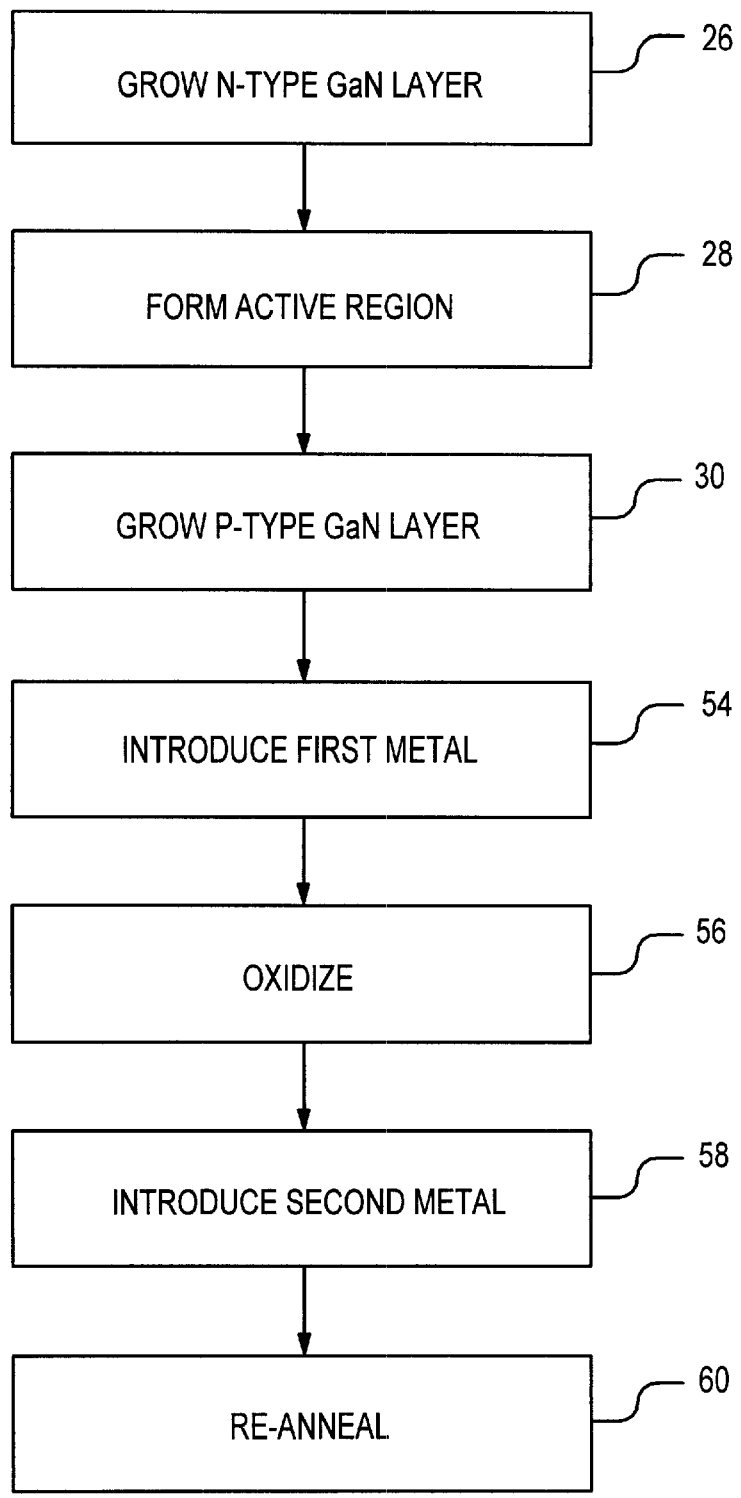
FIG. 8 is a process flow of steps for forming a contact structure in accordance with yet another application of the invention.

FIG. 8 is another application of the invention. In this application, the contact structure is exposed to two separate anneal steps. The conventional steps 26, 28 and 30 are followed to form the GaN layers and the active region. In step 54, Ni is evaporated to a selected thickness. Other metals may be substituted for Ni, such as Group II and transition metals. Following the introduction of the first metal at step 54, an oxidation anneal cycle is employed to convert the first metal to a transparent metal oxide throughout its steps. Thus, if Ni is introduced at step 54, the metal is converted to NiO in step 56.

In step 58, the second metal is introduced. As noted above, the preferred material is Au, but other metals may be substituted for Au. The steps 54 and 58 may be implemented as metal evaporation steps. In one embodiment, the Ni layer has a thickness of 100 Å, while the Au layer has a thickness of 50 Å.

In step 60, the structure is re-annealed to drive the second metal through the metal oxide and to alloy the second metal to the p-type GaN layer, providing the contact structure shown in FIG. 5. The double-anneal process provides a contact structure having desirable characteristics with regard to optical, electrical and mechanical properties.

Figure 9:
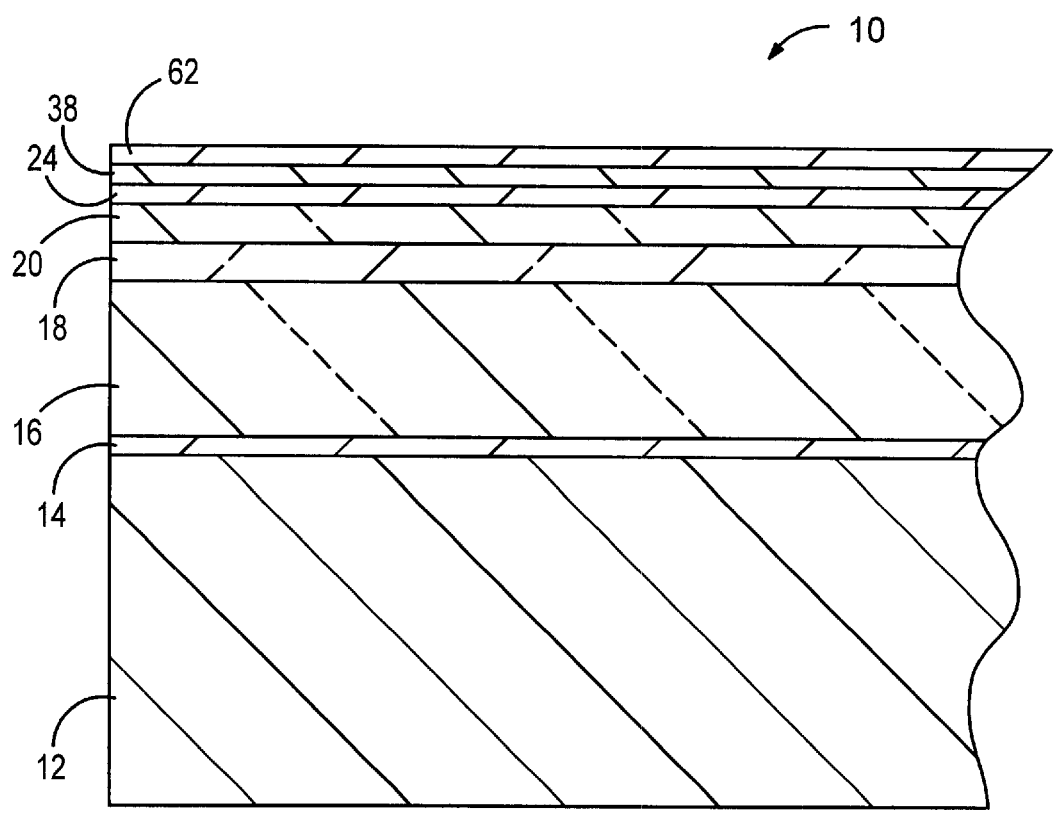
FIG. 9 is a side sectional view of a three-layer contact structure for the device of FIG. 1.

While the invention has been described with reference to providing a bi-layer (metal/metal oxide) contact structure, there are advantages to including more than two contact layers. Referring now to FIG. 9, a third contact layer 62 is shown as being formed atop the previously described second contact layer 38. The third contact layer is ITO that may be deposited to a thickness to allow enhanced current spreading beyond the ability of the first two layers. In one application, the ITO layer is added only after the first two layers 24 and 28 have been annealed to intermix the two layers. In this application, the third layer 62 is a separate layer that allows the thickness of the second metal (e.g., Au) to be reduced without sacrificing lateral conductivity. However, in other applications, the three layers are annealed to intermix material from all three layers.

In yet another application of a multi-layer contact structure, the first and the third layers 24 and 62 are Ni, while the center layer 38 is Au. The uppermost layer of Ni is intended to form an oxide initiation layer, which allows the oxidation process to begin without the Au layer 38 acting as a mask between the Ni and the oxidizing gas. Once the NiO formation has begun, the Au layer dissolves into it, allowing further penetration of the oxygen into the underlying Ni layer 24. The oxidation process continues until all of the Ni metal is consumed and converted to transparent oxide, with the Au migrating to the surface of the p-type GaN layer 20. In this way, the oxidation process is made more reproducible and uniform. The fundamental idea may be extended to other types of materials and to a greater number of layers, which interact during heat treatment to form structures with superior electrical and optical characteristics, as compared to structures formed from fewer numbers of layers. In one implementation of the Ni/Au/Ni multi-layer structure of FIG. 9, each of the three layers 24, 38 and 62 has a thickness of 35 Å.

Multi-layer structures may have a repeating pattern of layers, such as Ni/Au/Ni/Au. While only three contact layers 24, 38 and 62 are shown in FIG. 9, additional layers may be provided.

Figure 10:
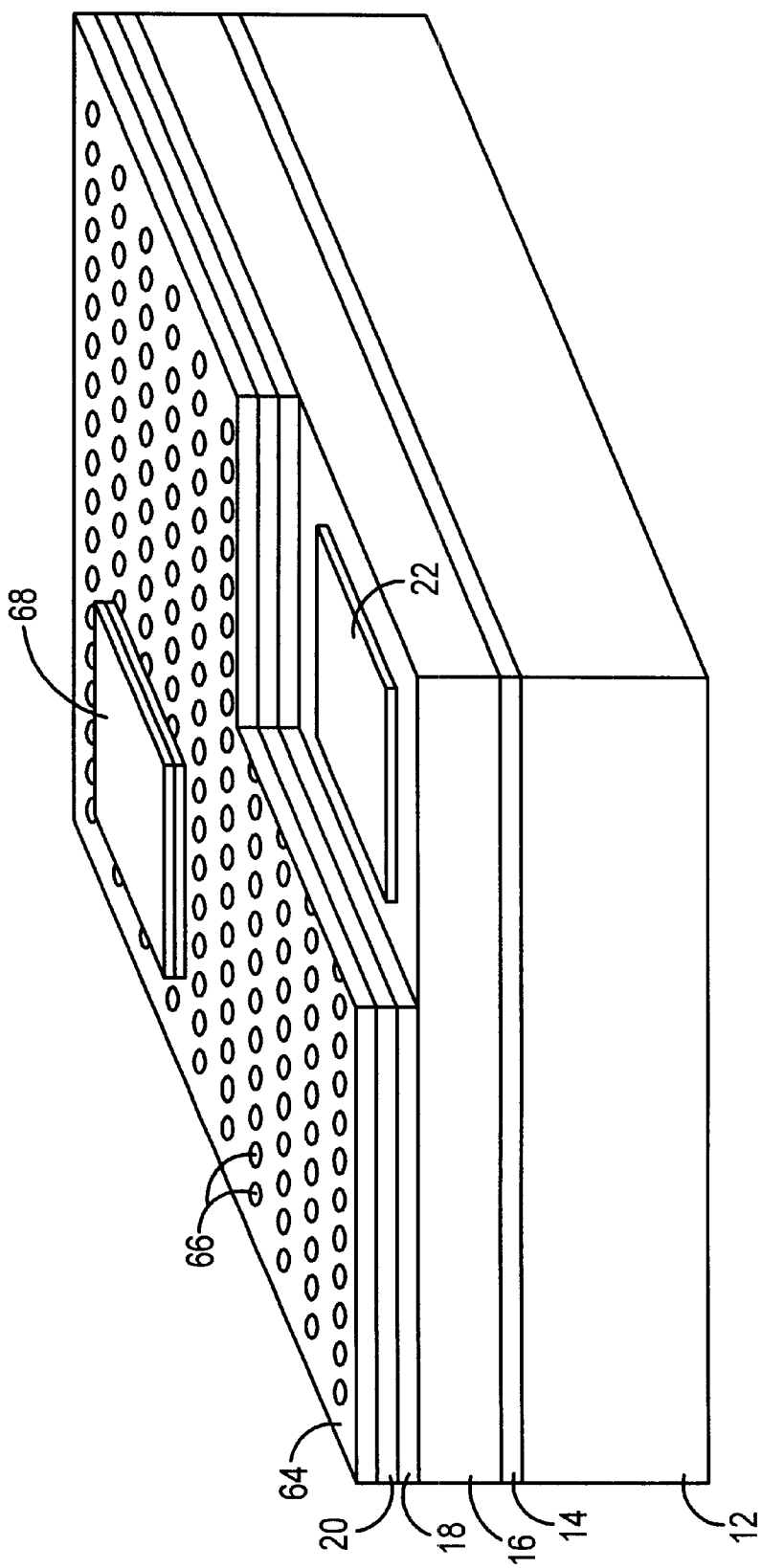
FIG. 10 is a perspective view of the optoelectronic device of FIG. 1 having a patterned contact structure in accordance with the invention.
Figure 11:
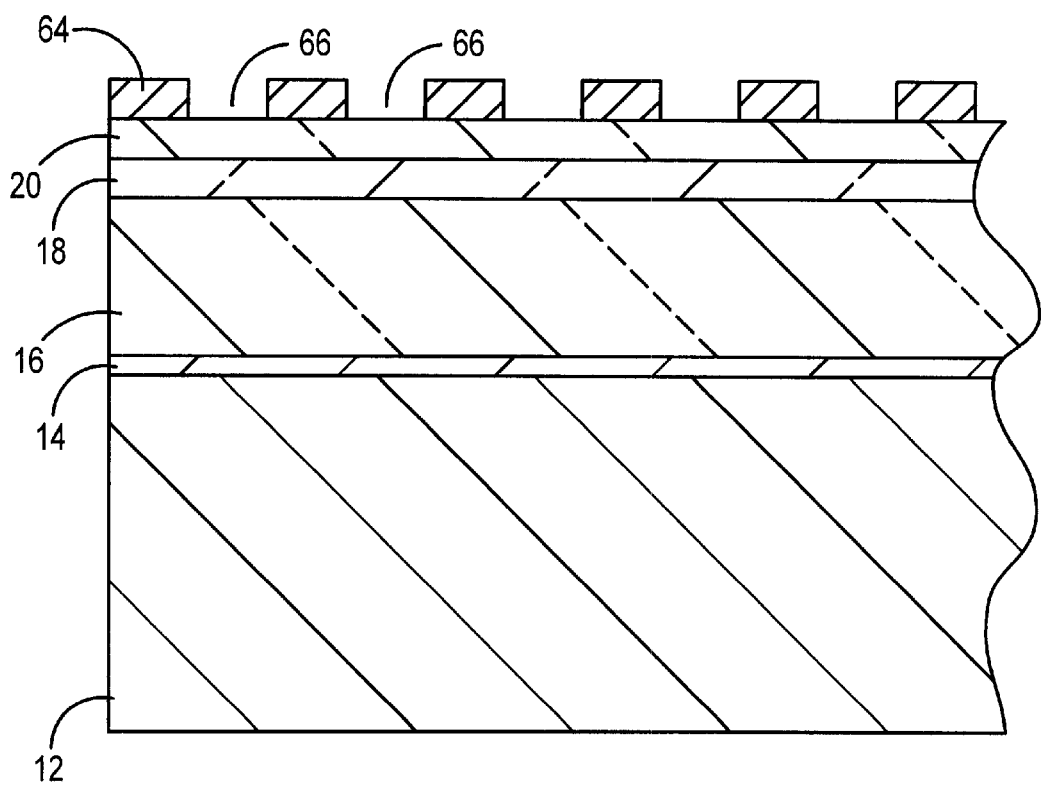
FIG. 11 is a side sectional view of the device of FIG. 10.

Referring now to FIGS. 10 and 11, in another application, the contact structure 64 for the p-type GaN layer 20 includes a series of openings 66 that are provided by patterning the contact layers formed in any of the above-described methods. For example, the first contact material may be deposited in an oxidized condition, the second material may be evaporated onto the metal oxide, and the two layers may be patterned (for example, using photolithography) either prior to or after the anneal step that causes the second layer to penetrate the metal oxide layer. Conventional techniques may be used for the patterning of the contact layers.

Formed atop the contact structure 64 is an electrode 68 for connection to a source of an excitation signal. While the electrode is shown as being a two-layer structure, this is not critical. The electrode may be formed using conventional techniques.

Referring to FIG. 11, the material of the contact structure 64 is interlinked to provide conductivity along the entire surface of the p-type GaN layer 20. However, the openings 66 act as windows for enhancing the luminous output of the optoelectronic device. The openings 66 are shown as being circular, but this is not critical. The ratio of the window area to the total surface area is preferably maximized, while maintaining sufficient lateral conductivity. Oval openings or other configurations may be selected as being preferential to the circular openings.

In FIGS. 10 and 11, all of the layers of the contact structure are patterned. The patterning can occur before or after the highly conductive metal (e.g., Au) is driven through the metal oxide (e.g., NiO). In accordance with FIGS. 10 and 11, if more than two layers form the contact structure, the additional layer or layers (e.g., an ITO layer) are also patterned.

Figure 12:
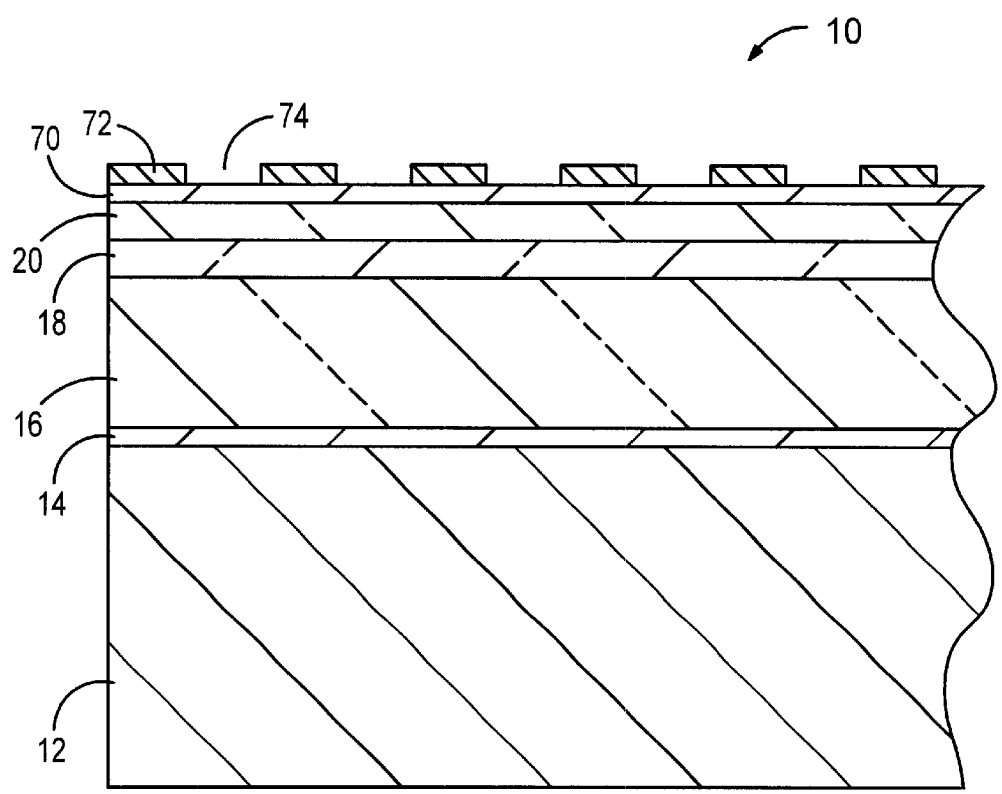
FIG. 12 is an alternative application of the patterned contact structure of FIG. 10.

A modification of the structure of FIG. 11 is shown in FIG. 12. Rather than patterning all layers of a contact structure, at least one layer is left unpatterned. For example, a metal oxide layer 70 (e.g., NiO) may be deposited as described with reference to FIG. 3, and a highly conductive layer 72 (e.g., Ag) may be formed atop the metal oxide layer. Openings 74 in the metal layer function as windows. The shape of the windows is not critical, as noted with reference to FIGS. 10 and 11. As another example, the unpatterned material 70 may be NiO:Au and the patterned layer may be Ag. In this example, the concentration of Au may be reduced, with the Au providing the ohmic contact to the p-type GaN layer 20 and the Ag providing the required lateral conductivity. This is also possible if the unpatterned material (i.e., blanket material) includes a top layer of ITO and the patterned layer is highly conductive. The blanket layer of ITO allows the ratio of window area to total surface area to increase, while maintaining sufficient lateral conductivity.

What is claimed is:

1. A method of forming a light-transmissive contact of a light source comprising steps of:

forming at least one layer of p-type Gallium nitride (GaN) as one layer of an optoelectronic device;

selecting a metal to form a conductive light-transmissive layer on a surface of said p-type GaN layer; and introducing said selected metal onto said surface as an oxidized material, such that said selected metal is oxidized before or during introduction of said selected metal onto said p-type GaN layer.

2. The method of claim 1 wherein said step of selecting a metal is a selection between nickel (Ni), a Group II metal and a transition metal, said step of introducing said selected metal thereby being executed as a step of depositing one of a selected metal oxide as NiO, a Group II metal oxide and a transition metal oxide.

3. The method of claim 2 further comprising steps of forming a layer of precious metal on said selected metal oxide and heat treating said selected metal oxide and said layer of precious metal, thereby enabling said precious metal to penetrate said selected metal oxide and diffuse to said p-type GaN layer.

4. The method of claim 2 wherein said step of depositing said selected metal oxide includes simultaneously introducing a precious metal onto said surface, thereby forming a layer that is a combination of said selected metal oxide and said precious metal.

5. The method of claim 4 wherein said step of simultaneously depositing said selected metal oxide and said precious metal includes one of reactively co-evaporating and reactively co-sputtering NiO and Au.

6. The method of claim 1 further comprising steps of:

forming a second metal on said selected metal;

diffusing said second metal through said selected metal; and forming a layer of ITO to enhance lateral conductivity along said surface of said p-type GaN layer.

7. The method of claim 1 wherein said step of introducing said selected metal forms a seed layer and is followed by steps of:

forming a second layer of said selected metal on said oxidized selected metal;

depositing a layer of conductive material; and annealing said seed layer, said second layer and said layer of conductive material to diffuse said conductive material to said p-type GaN layer.

8. The method of claim 1 further comprising steps of:

forming a layer of highly conductive material on said oxidized selected metal;

forming a second layer of said selected metal on said layer of highly conductive material; and executing an anneal to oxidize said second layer and to diffuse said highly conductive material through said oxidized selected material to reach said surface of said p-type GaN layer.

9. The method of claim 1 wherein said step of introducing said selected metal includes depositing NiO using one of reactive evaporation and reactive sputtering, said depositing being followed by steps of:

depositing Au; and annealing said NiO and Au in an environment that is substantially free of oxygen.

10. The method of claim 1 wherein said step of introducing said selected metal includes depositing NiO using one of reactive evaporation and reactive sputtering, said depositing being followed by steps of:

depositing conductive material; and annealing said NiO and conductive material in an environment that is substantially free of water vapor, wherein p-doping of said p-type GaN layer is activated.

11. The method of claim 1 wherein said step of introducing said selected metal includes depositing NiO using one of reactive evaporation and reactive sputtering, said depositing being followed by steps of:

depositing conductive material; and annealing said NiO and conductive material in an environment that is substantially free of $H_2$, wherein p-doping of said p-type GaN layer is activated.

12. The method of claim 1 further comprising a step of forming at least one patterned electrically conductive layer on said oxidized selected metal.

13. The method of claim 12 further comprising a step of diffusing said at least one patterned electrically conductive layer through said oxidized selected metal.

14. A method of forming a light-transmissive contact of a light source comprising steps of:

forming at least one layer of p-type GaN as one layer of an optoelectronic device;

forming first and second contact layers on said p-type GaN layer such that said contact layers include at least one of Ni, a transition metal and a Group II metal and include a highly conductive metal; and forming an oxidizing environment and exposing said first and second contact layers to said oxidizing environment, including introducing water vapor and oxygen gas into said oxidizing environment to oxidize said at least one of Ni, a transition metal and said Group II metal and to diffuse said highly conductive metal into said p-type GaN layer, said water vapor being introduced in a concentration greater about 40% relative humidity.

15. The method of claim 14 wherein said step of forming said oxidizing environment includes introducing said water vapor to a flow of dry air and includes heating said oxidizing environment to a temperature substantially exceeding 550° C., such that p-doping of said p-type GaN layer is activated.

16. The method of claim 15 wherein said step of forming said oxidizing environment includes providing oxygen in a non-reactive gas.

17. The method of claim 16 wherein said step of forming said first and second contact layers includes forming a first contact layer of Ni and a second contact layer of Au.

18. The method of claim 14 further comprising forming a third contact layer of Ni prior to said step of forming an oxidizing environment, such that a multi-layer structure of Ni/Au/Ni is formed.

19. A method of forming a contact structure of a light source comprising steps of:

forming at least one layer of p-type GaN as one layer of an optoelectronic device;

forming first and second contact layers on said p-type GaN layer such that said contact layers include at least one of Ni, a transition metal and a Group II metal and include a highly conductive metal; and forming an oxidizing environment and exposing said first and second contact layers to said oxidizing environment, including introducing water vapor and oxygen gas into said oxidizing environment to oxidize said at least one of Ni, a transition metal and said Group II metal and to diffuse said highly conductive metal into said p-type GaN layer, said water vapor being introduced in a concentration greater than about 40% relative humidity, said oxidizing environment being heated to a temperature substantially exceeding 550° C., such that p-doping of said p-type GaN layer is activated.

20. The method of claim 19 wherein said step of forming said oxidizing environment includes providing oxygen in a non-reactive gas.

21. The method of claim 20 wherein said step of forming said first and second contact layers includes forming a first contact layer of Ni and a second contact layer of Au.

22. The method of claim 19 further comprising forming a third contact layer of Ni prior to said step of forming an oxidizing environment, such that a multi-layer structure of Ni/Au/Ni is formed.

23. The method of claim 12, further comprising a step of diffusing said at least one patterned electrically conductive layer through said oxidized selected metal, wherein said patterned electrically conductive layer has a series of openings.

* * * * *